(12) United States Patent
Park

(10) Patent No.: US 11,515,389 B2
(45) Date of Patent: Nov. 29, 2022

(54) SEMICONDUCTOR DEVICE AND METHOD FOR FABRICATING THE SAME

(71) Applicant: SK hynix Inc., Gyeonggi-do (KR)

(72) Inventor: Hae Jung Park, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 17/173,539

(22) Filed: Feb. 11, 2021

(65) Prior Publication Data

US 2022/0085158 A1     Mar. 17, 2022

(30) Foreign Application Priority Data

Sep. 14, 2020   (KR) ........................ 10-2020-0117593

(51) Int. Cl.
| | |
|---|---|
| *H01L 29/66* | (2006.01) |
| *H01L 29/06* | (2006.01) |
| *H01L 29/78* | (2006.01) |
| *H01L 29/423* | (2006.01) |
| *H01L 21/768* | (2006.01) |
| *H01L 21/285* | (2006.01) |
| *H01L 29/49* | (2006.01) |

(52) U.S. Cl.
CPC .... *H01L 29/0653* (2013.01); *H01L 21/28525* (2013.01); *H01L 21/76831* (2013.01); *H01L 21/76879* (2013.01); *H01L 29/42356* (2013.01); *H01L 29/49* (2013.01); *H01L 29/7813* (2013.01)

(58) Field of Classification Search
CPC ......... H01L 29/06; H01L 29/49; H01L 29/78; H01L 29/423; H01L 29/7813; H01L 29/42356; H01L 29/0653; H01L 23/532; H01L 23/53223; H01L 23/53238; H01L 23/53252; H01L 23/53266; H01L 21/285; H01L 21/768; H01L 21/28531; H01L 21/76831; H01L 21/76879; H01L 21/76876; H01L 21/76841; H01L 21/02362; H01L 2221/1073; H01L 2221/1089; H01L 27/108; H01L 27/1085; H01L 27/10885; H01L 27/10805; H01L 27/10844; H01L 27/10823; H01L 27/10855; H01L 27/10814
USPC ....................................................... 257/330
See application file for complete search history.

(56) References Cited

U.S. PATENT DOCUMENTS

| | | | | |
|---|---|---|---|---|
| 6,818,537 B2* | 11/2004 | Cheong | ............. | H01L 21/28562 438/677 |
| 8,729,618 B2* | 5/2014 | Kuroki | ............. | H01L 21/28525 257/311 |
| 2003/0003718 A1* | 1/2003 | Park | .................. | H01L 21/76819 257/E21.244 |
| 2003/0022486 A1* | 1/2003 | Wu | .................... | H01L 21/76877 257/E21.585 |

(Continued)

*Primary Examiner* — Chuong A Luu
(74) *Attorney, Agent, or Firm* — IP & T Group LLP

(57) ABSTRACT

A semiconductor device including: a semiconductor substrate including an active region; a plurality of conductive structures formed over the semiconductor substrate; an isolation layer filling a space between the conductive structures and having an opening that exposes the active region between the conductive structures; a pad formed in a bottom portion of the opening and in contact with the active region; a plug liner formed conformally over a sidewall of the opening and exposing the pad; and a contact plug formed over the pad inside the opening.

11 Claims, 24 Drawing Sheets

(56) References Cited

U.S. PATENT DOCUMENTS

2015/0061136 A1    3/2015   Yoo et al.
2018/0350611 A1   12/2018   Kim et al.

\* cited by examiner

SEMICONDUCTOR DEVICE AND METHOD FOR FABRICATING THE SAME

CROSS-REFERENCE TO RELATED APPLICATIONS

The present application claims priority to Korean Patent Application No. 10-2020-0117593, filed on Sep. 14, 2020, which is incorporated herein by reference in its entirety.

BACKGROUND

1. Field

Various embodiments of the present disclosure relate to a semiconductor device and a method for fabricating the same. More particularly, the embodiments of the present disclosure relate to a semiconductor device including a storage node contact and a method for fabricating the semiconductor device.

2. Description of the Related Art

As the degree of integration of semiconductor devices is reduced and the size of the semiconductor devices shrinks, the size of contact plugs is reduced. Along with the miniaturization of the contact plugs, the aspect ratio of contact holes is increasing.

However, during an etching process for forming a contact hole having a high aspect ratio, mis-alignment and an issue with some contact holes not opening may occur.

The defects of contact holes due to the high-aspect-ratios deteriorate the electric& characteristics of a semiconductor device and makes the process for fabricating contact plugs more difficult.

SUMMARY

Embodiments of the present disclosure are directed to a semiconductor device having excellent electrical characteristics and a method for fabricating the same.

In accordance with an embodiment of the present disclosure, a semiconductor device includes: a semiconductor substrate including an active region; a plurality of conductive structures formed over the semiconductor substrate; an isolation layer filling a space between the conductive structures and having an opening that exposes the active region between the conductive structures; a pad formed in a bottom portion of the opening and in contact with the active region; a plug liner formed conformally over a sidewall of the opening and exposing the pad; and a contact plug formed over the pad inside the opening.

In accordance with another embodiment of the present disclosure, a semiconductor device includes: a semiconductor substrate including an active region; a plurality of bit line structures formed over the semiconductor substrate; an isolation layer filling a space between the bit line structures and having an opening that exposes the active region between the bit line structures; a pad formed in a bottom portion of the opening and in contact with the active region; a first spacer formed over conformally on a sidewall of the opening and exposing the pad; a plug liner formed to cover a lower portion of the first spacer; a second spacer formed over the plug liner to cover a upper portion of the first spacer; and a contact plug formed over the pad inside of the opening.

In accordance with yet another embodiment of the present disclosure, a method for fabricating a semiconductor device includes: providing a substrate including a plurality of active regions; forming a plurality of bit line structures over an upper portion of the substrate; forming an isolation layer filling a space between the bit line structures and having an opening exposing the active regions between the bit line structures; forming a pad in a bottom portion of the opening; forming plug liner over a sidewall of the opening and exposing the pad; and forming a contact plug filling the opening over the pad.

In accordance with still another embodiment of the present disclosure, a method for fabricating a semiconductor device includes: forming a plurality of conductive structures over an upper portion of a substrate; forming an isolation layer having an opening that exposes the substrate between the conductive structures while filling a space between the conductive structures; forming a pad in a bottom portion of the opening; sequentially forming spacer and plug liner over a sidewall of the opening and exposing the pad; and forming a contact plug filling the opening over the pad.

In accordance with still another embodiment of the present disclosure, a method for fabricating a semiconductor device includes: providing a substrate including a plurality of active regions; forming a plurality of bit line structures over an upper portion of the substrate; forming an isolation layer having an opening that exposes the active regions between the bit line structures while filling the space between the bit line structures; forming a pad in a bottom portion of the opening; forming a first spacer over a sidewall of the opening and exposing the pad; forming a plug liner covering in lower portion of the first spacer; forming a first contact plug filling a portion of the opening over the pad; forming a second spacer over the plug liner and covering an upper portion of the first spacer; and forming a second contact plug filling a remaining portion of the opening over the first contact plug.

These and other advantages of the present invention will be described in more detail in the following description by referring to the following drawings.

DETAILED DESCRIPTION

Figure 1:
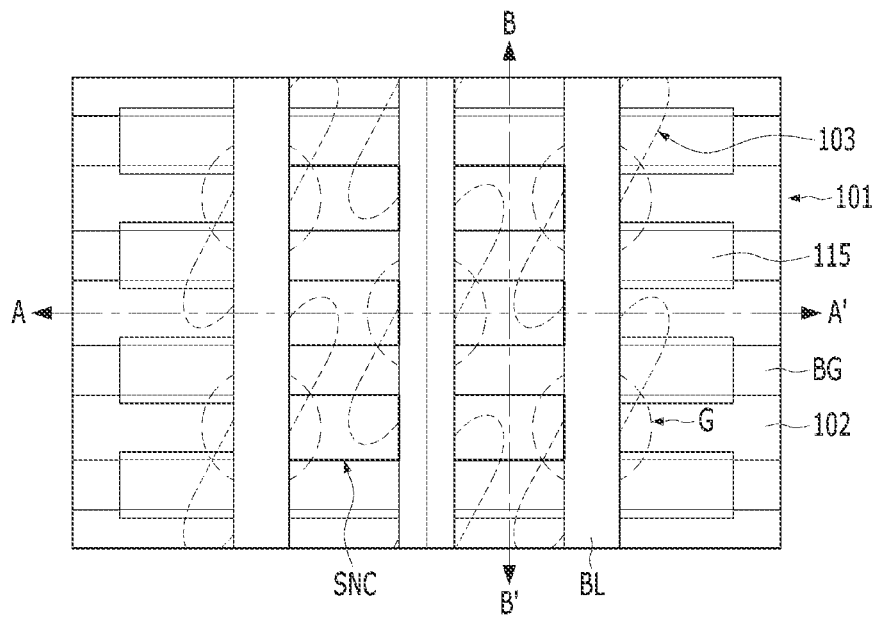
FIG. 1 is a plan view illustrating a semiconductor device in accordance with an embodiment of the present disclosure.

Various embodiments of the present disclosure will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present disclosure.

The drawings are not necessarily to scale and, in some instances, proportions may have been exaggerated to clearly illustrate various features of the embodiments. When a first layer is referred to as being "on" a second layer or "on" a substrate, it may not only refer to a case where the first layer is formed directly on the second layer or the substrate but also a case where a third layer exists between the first layer and the second layer or the substrate.

Hereinafter, in an embodiment of the present disclosure, a high aspect ratio pattern may include an opening, a contact hole, a trench, and source/drain recesses. As for the high aspect ratios, the height-to-width ratio may be greater than approximately 1:1. The high aspect ratio pattern may be filled with a contact plug. The lower portion of the high aspect ratio pattern may be filled with a pad. That is, a contact plug may be formed over the pad. The pad may also be referred to as a contact pad or a landing pad.

The pad may be filled with an epitaxial layer by a bottom-up growth process. The bottom-up growth process may include a Selective Epitaxial Growth (SEG) process.

Figure 2A:
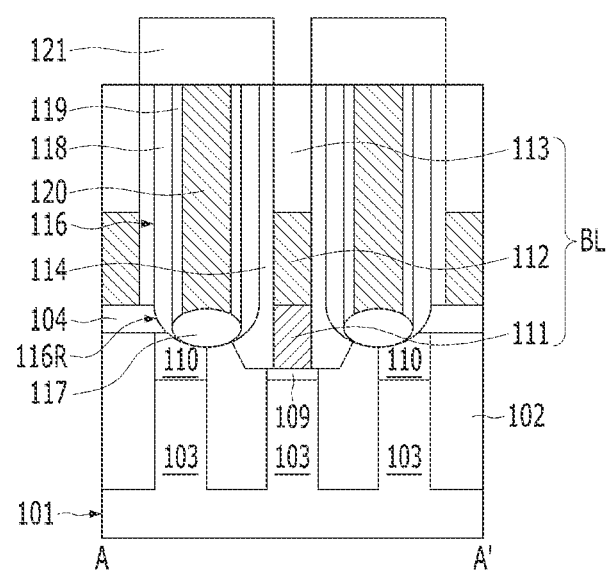
FIGS. 2A and 2B are cross-sectional views illustrating an example of a semiconductor device in accordance with an embodiment of the present disclosure.
Figure 2B:
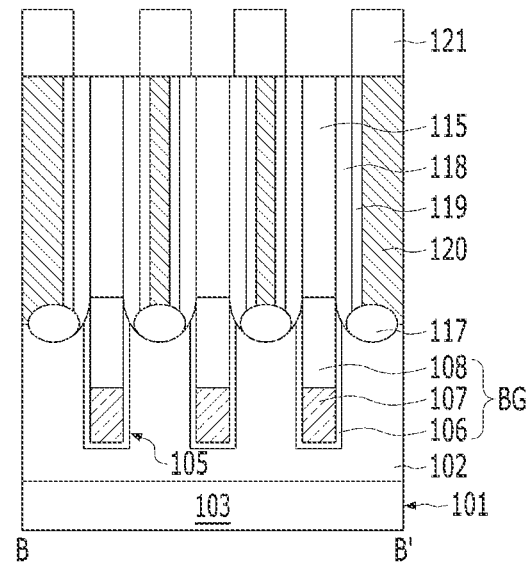

FIG. 1 is a plan view illustrating a semiconductor device in accordance with an embodiment of the present disclosure. FIGS. 2A and 2B are cross-sectional views illustrating an example of a semiconductor device in accordance with an embodiment of the present disclosure.

Referring to FIGS. 1, 2A and 2B, the semiconductor device may include a plurality of memory cells. Each memory cell may include a cell transistor including a buried word line 107, a bit line 112, and a memory element 121.

An isolation layer 102 and an active region 103 may be formed in a substrate 101. A plurality of active regions 103 may be defined by the isolation layer 102. The substrate 101 may be formed of a material containing silicon. The substrate 101 may include silicon, monocrystalline silicon, polysilicon, amorphous silicon, silicon germanium, monocrystalline silicon germanium, polycrystalline silicon germanium, carbon-doped silicon, a combination thereof, or a multi-layer thereof. The substrate 101 may also include other semiconductor materials, such as germanium. The substrate 101 may include a III/V group semiconductor substrate, for example, a compound semiconductor substrate such as gallium arsenide (GaAs). The substrate 101 may include a Silicon-On-Insulator (SOI) substrate. The isolation layer 102 may be formed, for example, by a Shallow Trench Isolation (STI) process.

A line-shaped buried gate structure BG extending in a short axis direction of the active region 103 may be formed in the substrate 101. The buried gate structure BG may include a gate dielectric layer 106 formed on the surface of a gate trench 105, a gate electrode 107 formed over the gate dielectric layer 106 to fill the gate trench 105, and a gate capping layer 108.

To be specific, a line-shaped gate trench 105 extending in the short axis direction of the active region 103 may be formed in the substrate 101. The gate trench 105 may be formed to a predetermined depth in a region defined by a hard mask layer 104 which is formed on the surface of the substrate 101. The bottom surface of the gate trench 105 may be positioned at a higher level than the bottom surface of the isolation layer 102. For example, the gate trench 105 may have a shallower depth than the isolation layer 102. The bottom portion of the gate trench 105 may be flat, According to another embodiment of the present disclosure (not shown), the bottom portion of the gate trench 105 may have a curvature. According to another embodiment of the present disclosure, the isolation layer 102 of a direction that the gate trench 105 extends may be etched to a predetermined depth to form a fin region Fin in the active region 103.

A gate dielectric layer 106 may be formed on the surface of the gate trench 105. A gate electrode 107 filling a portion of the gate trench 105 may be formed over the gate dielectric layer 106. A gate capping layer 108 filling the remaining portion of the gate trench 105 may be formed over the gate electrode 107. The upper surface of the gate capping layer 108 may be positioned at the same level as the upper surface of the hard mask layer 104. The upper surface of the gate electrode 107 may be positioned at a lower level than the upper surface of the substrate 101. The gate electrode 107 may be formed of a low resistance metal material, including, for example, titanium nitride and tungsten that are sequentially stacked. According to another embodiment of the present disclosure, the gate electrode 107 may be formed of titanium nitride only. The gate electrode 107 may be referred to as a buried word line.

First and second impurity regions 109 and 110 may be formed in the substrate 101. The first and second impurity regions 109 and 110 may be referred to as source/drain regions. The first and second impurity regions 109 and 110 may be spaced apart from each other by the gate trench 105. The gate electrode 107 and the first and second impurity regions 109 and 110 may be referred to also as a cell transistor. The cell transistor may exhibit an improved short channel effect by the gate electrode 107.

A bit line contact plug 111 may be formed over the first impurity region 109 of the substrate 101. The bit line contact plug 111 may be coupled, e.g., by direct contact, to the first impurity region 109. The bit line contact plug 111 may be positioned in the bit line contact hole. The bit line contact hole may expose the first impurity region 109. The lower surface of the bit line contact plug 111 may be lower than the upper surface of the substrate 101. The bit line contact plug 111 may be formed, for example, of polysilicon or a metal material. A portion of the bit line contact plug 111 may have a line width which is smaller than the diameter of the bit line contact hole. Accordingly, gaps G may be formed on both sides of the bit line contact plug 111, respectively. The gaps G may be independently formed on both sides of the bit line contact plug 111. As a result, one bit line contact plug 111 and a pair of gaps G may be positioned in the bit line contact hole, and the pair of gaps G may be isolated by the bit line contact plug 111. A gap may be positioned between the bit line contact plug 111 and a contact plug 120.

A bit line structure BL may be formed which includes the bit line contact plug 111, a bit line 112 formed over the bit line contact plug 111, and a bit line hard mask 113 formed over the bit line 112. The bit line structure BL may have a line shape extending in a direction intersecting with the buried gate structure BG, that is, in the long axis direction of the active region 103. A portion of the bit line 112 may be coupled, e.g., by direct contact, to the bit line contact plug 111. From the perspective of a line A-A' direction, the bit line 112 and the bit line contact plug 111 may have the same line width. Accordingly, the bit line 112 may extend in one direction while covering the bit line contact plug 111. The bit line 112 may include a metal material. The bit line hard mask 113 may be formed of or include a dielectric material.

A bit line spacer 114 may be formed on a sidewall of the bit line structure BL. The bottom portion of the bit line spacer 114 may fill the gaps G on both sides of the bit line contact plug 111. The bit line spacer 114 may be formed of or include a dielectric material. The bit line spacer 114 may be formed of or include, for example, silicon oxide, silicon nitride, or a combination thereof. The bit line spacer 114 may include a NON (Nitride-Oxide-Nitride) structure, According to another embodiment of the present disclosure, the bit line spacer 114 may include an air gap. For example, it may include a NAN (Nitride-Air gap-Nitride) structure.

From the perspective of a direction parallel to the bit line structure BL, the plug isolation layer 115 may be formed between the neighboring contact plugs 120. The plug isolation layer 115 may be formed between the neighboring bit line structures BL, and may define a rectangular opening 116 of an island type separated from each other. The opening 116 may be an opening having a square shape which is defined by the bit line structure BL and the bit line isolation layer 115. The upper-to-lower and left-to-right line widths of the opening 116 may be controlled by the bit line structure and the bit line spacers BL and 114.

A recess 116R may be formed in a bottom portion of the opening 116. The recess 116R may extend into the substrate 101. The bottom surface of the recess 116R may be positioned at a lower level than the upper surface of the substrate 101. The bottom surface of the recess 116R may have a higher level than the bottom surface of the bit line contact plug 111.

A pad 117 in contact with the second source/drain regions 110 may be formed in the recess 116R. The pad 117 may fill the recess 116R. The pad 117 may couple the contact plug 120 and the second impurity region 110 to each other. The pad 117 may be formed, for example, by a selective Epitaxial Growth process.

The pad 117 may be formed, for example, by a Bottom-Up Growth process. The bottom-up growth process may include an epitaxial growth process. The epitaxial growth process may include a selective epitaxial growth process. The pad 117 may include a silicon-containing epitaxial layer. For example, the pad 117 may include a silicon epitaxial layer. The pad 117 may include SEG Si.

The pad 117 may include a dopant. Accordingly, the pad 117 may be a doped epitaxial layer. The dopant may include an N-type dopant. The N-type dopant may include phosphorus, arsenic, antimony, or a combination thereof. The pad 117 may include a silicon epitaxial layer doped with phosphorus formed by a selective epitaxial growth process, that is, heavily doped SEG SiP. Herein, in the low-concentration SEG SiP and the high-concentration SEG SiP, each of the low concentration and the high concentration may refer to the concentration of phosphorus.

According to another embodiment of the present invention, the pad 117 may include SEG SiGe doped with an N-type dopant or SEG SiC doped with an N-type dopant.

The recesses 116R between the pads 117 may be gap-filled with the spacers 118. That is, a spacer 118 may be formed on a sidewall of the bit line spacer 114. The spacer 118 may be formed of or include a dielectric material. The spacer 118 may be formed of or include, for example, silicon oxide.

A plug liner 119 may be formed on a sidewall of the spacer 118. The plug liner 119 may be formed on the upper portion of the pad 117. The plug liner 119 may be formed of or include, for example, polysilicon.

The contact plug 120 may be formed on an upper portion of the pad 117. The contact plug 120 may be formed between the neighboring bit line structures BL. The contact plug 120 may be formed in the opening 116. The contact plug 120 may be coupled to the second impurity region 110 by the pad 117. The contact plug 120 may be or include a conductive material. The contact plug 120 may be formed of or include, for example, polysilicon or a metal material.

According to an embodiment of the present disclosure, the plug liner 119 may serve as a contact plug together with the contact plug 120. The plug liner 119 and the contact plug 120 may be referred to as a 'storage node contact plug'. For example, the width of the storage node contact plug may be increased as much as the thickness of the plug liner 119, thereby securing an overlay margin with the subsequently formed memory element 121 and reducing a contact resistance.

The memory element 121 may be formed over the contact plug 120. The memory element 121 may include a capacitor including a storage node. The storage node, for example, may be or include a pillar type storage node. Although not illustrated, a dielectric layer and a plate node may be further formed over the storage node. In an embodiment, the storage node may have a cylinder shape. The storage node may be coupled, e.g., by direct contact, to the contact plug 120.

According to another embodiment of the present disclosure, memory elements implemented in various ways over the contact plug 120 may be coupled to the contact plug 120 directly or indirectly.

Figure 3A:
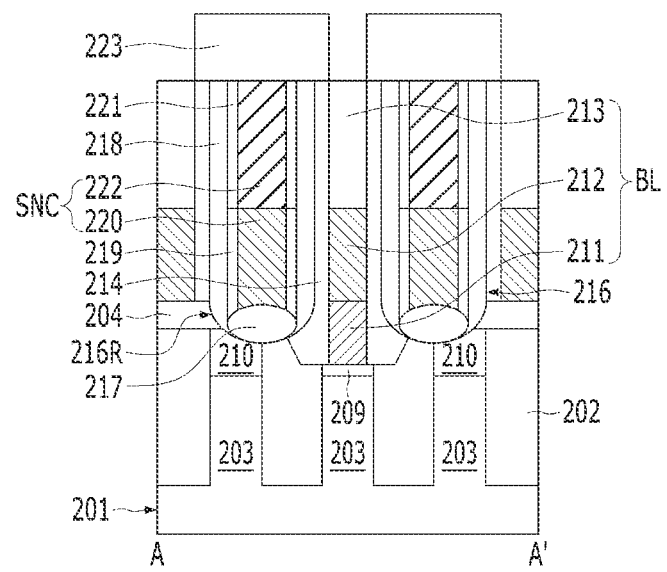
FIGS. 3A and 3B are cross-sectional views illustrating another example of the semiconductor device in accordance with an embodiment of the present disclosure.
Figure 3B:
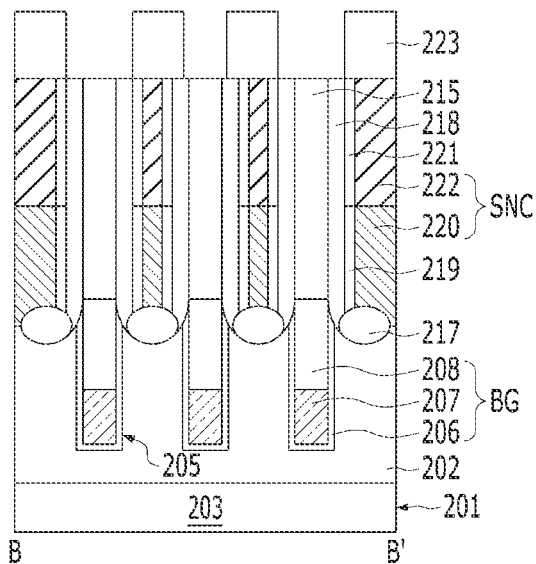

FIGS. 3A and 3B are cross-sectional views illustrating another example of the semiconductor device in accordance with an embodiment of the present disclosure. FIGS. 3A and 33 include a semiconductor device having a storage node contact plug SNC having a different structure from that of FIGS. 2A and 23.

Referring to FIGS. 3A and 3B, the semiconductor device may include a plurality of memory cells. Each memory cell may include a cell transistor including a gate electrode 207, a bit line 212, and a memory element 223.

The gate electrode 207 and the bit line 212 may have the same structure as that of FIGS. 2A and 2B.

Island-type rectangular openings 216 isolated by a plug separation layer 215 which is formed between the neighboring bit line structures BL may be defined. The vertical line width and the lateral line width of each opening 216 may be controlled by the bit line structure BL and the bit line spacer 214.

The recess 216R may be formed in a bottom portion of the opening 216. The recess 216R may extend into the substrate 201. The bottom surface of the recess 216R may be positioned at a lower level than the upper surface of the substrate 201. The bottom surface of the recess 216R may be positioned at a higher level than the bottom surface of the bit line contact plug 211.

The pad 217 in contact with the second source/drain region 210 may be formed in the recess 216R. The pad 217 may fill the recess 216R. The pad 217 may couple the contact plug SNC and the second impurity region 210. The pad 217 may be formed, for example, by a selective epitaxial growth process.

The pad 217 may be formed, for example, by a bottom-up growth process. The bottom-up growth process may include an epitaxial growth process. The epitaxial growth process may include a selective epitaxial growth process. The pad 217 may include a silicon-containing epitaxial layer. For example, the pad 217 may include a silicon epitaxial layer. The pad 217 may include SEG Si.

The recesses 216R remaining between the pads 217 may be gap-filled with the first spacer 218. The first spacer 218 may be formed on a sidewall of the bit line spacer 214. The first spacer 218 may be formed of or include a dielectric material. The first spacer 218 may be formed of or include, for example, silicon oxide.

A plug liner 219 may be formed on a portion of each sidewall of the first spacer 218. The plug liner 219 may be formed on the upper portion of the pad 217. The plug liner 219 may be formed of or include, for example, polysilicon.

A first contact plug 220 may be formed over the pad 217 to directly contact an upper portion of the pad 217. The first contact plug 220 may be formed between the neighboring bit line structures BL. The first contact plug 220 may be coupled to the second impurity region 210 via the pad 217. The first contact plug 220 may be or include a conductive material. The first contact plug 220 may be formed of or include, for example, polysilicon or a metal material. The upper surface of the first contact plug 220 may be positioned at the same level as the upper surface of the plug liner 219.

According to an embodiment of the present disclosure, the plug liner 219 may serve as a contact plug together with the first contact plug 220.

A second spacer 221 may be formed over the plug liner 219. The second spacer 221 may be formed on a portion of each of both sidewalls of the first spacer 218. The second spacer 221 may be formed of or include a dielectric material. The second spacer 221 may be or include silicon nitride.

A second contact plug 222 may be formed over the first contact plug 220. The second contact plug 222 may be in direct contact with the first contact plug 220. The second contact plug 222 may include the same material as that of the first contact plug 220. A contact plug structure SNC may be defined by the first contact plug 220 and the second contact plug 222. Also, according to an embodiment of the present disclosure, the plug liner 219 may be included in the contact plug structure SNC. For example, the lower contact of the contact plug structure SNC may be the plug liner 219 and the first contact plug 220, and the upper contact may be the second contact plug 222. In this case, the lower contact may have a wider width than the upper contact.

According to another embodiment of the present disclosure, an ohmic contact layer and an interfacial doping layer may be further included between the first contact plug 220 and the second contact plug 222.

A memory element 223 may be formed over the second contact plug 222. The memory element 223 may be in direct contact with the second contact plug 222.

Figure 4A:
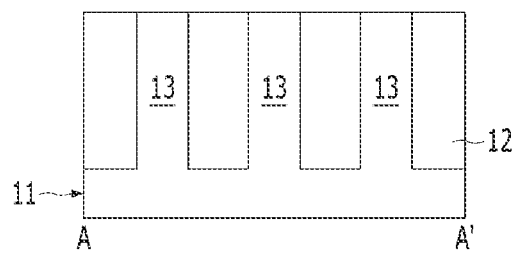
FIGS. 4A to 4U are cross-sectional views illustrating a method for fabricating a semiconductor device by presenting a cross section taken along a line A-A' of FIG. 1.
Figure 4B:
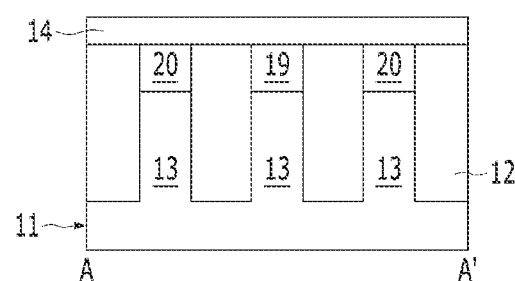
Figure 4C:
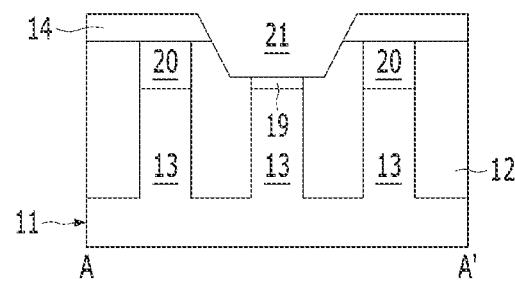
Figure 4D:
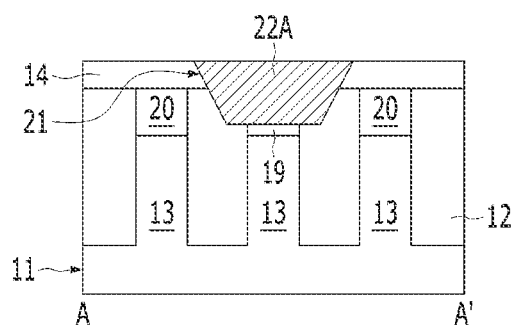
Figure 4E:
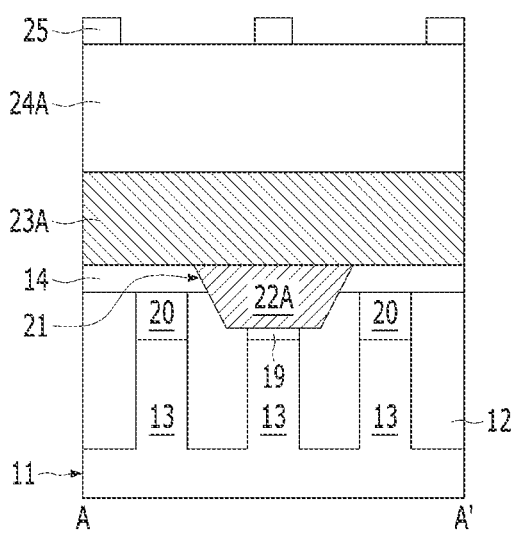
Figure 4F:
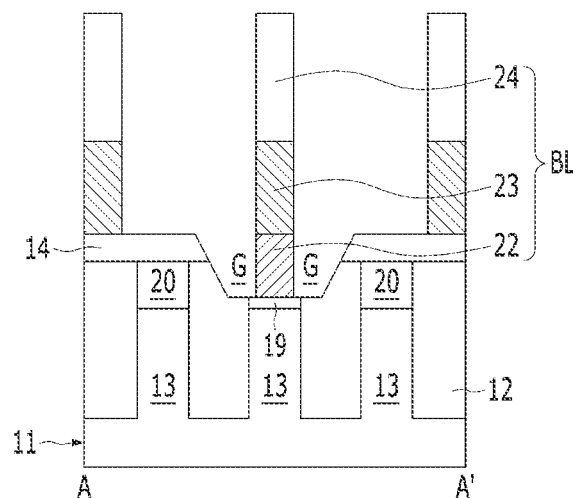
Figure 4G:
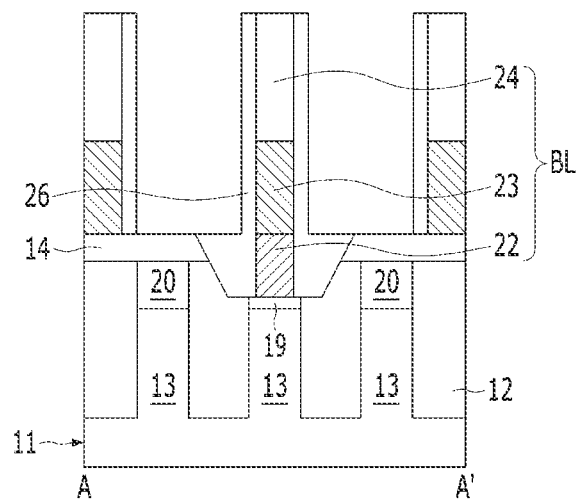
Figure 4H:
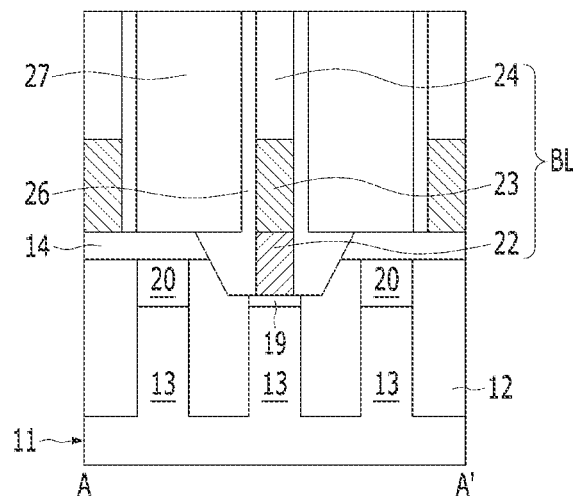
Figure 4I:
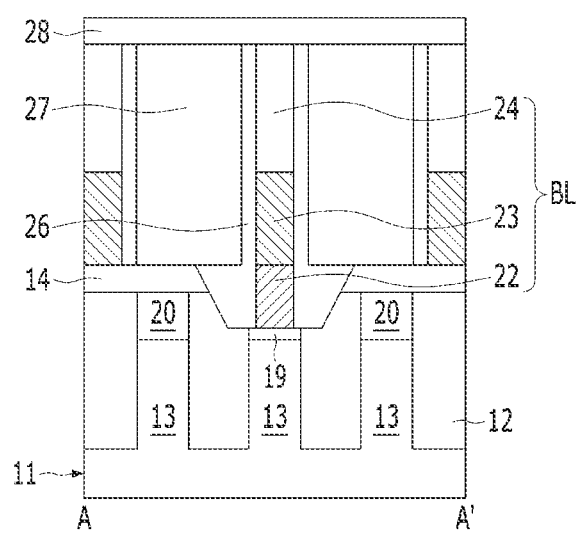
Figure 4J:
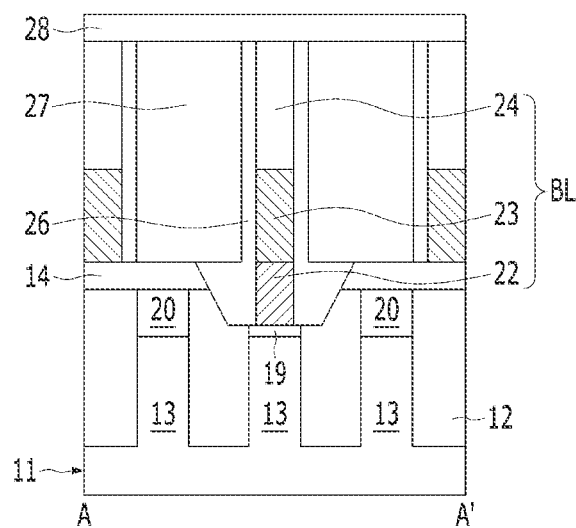
Figure 4K:
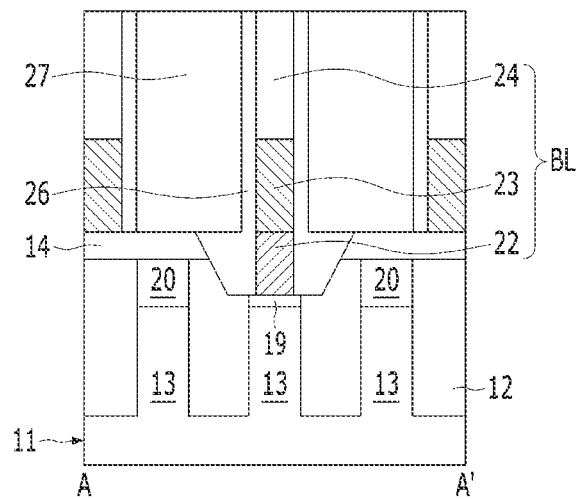
Figure 4L:
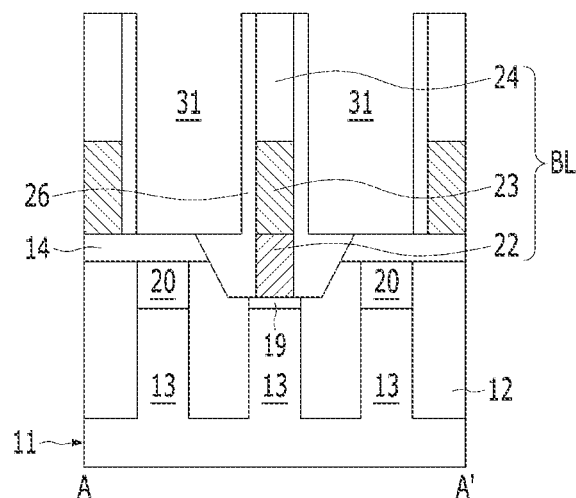
Figure 4M:
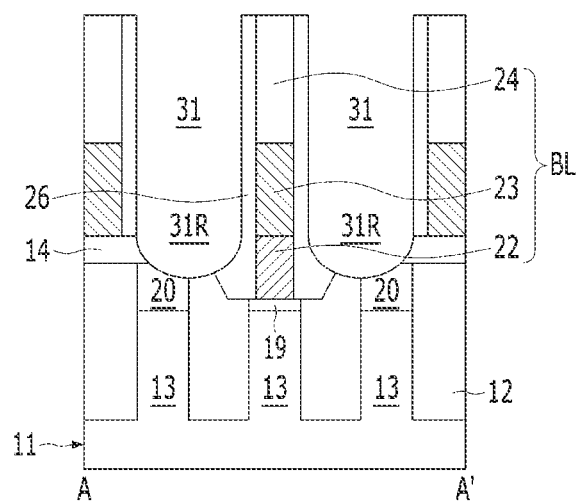
Figure 4N:
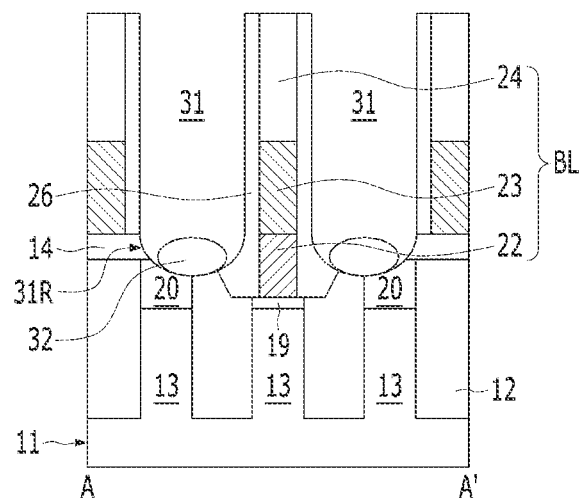
Figure 4O:
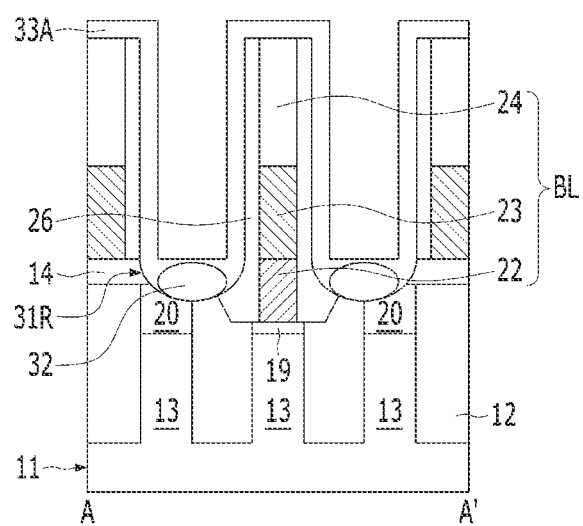
Figure 4P:
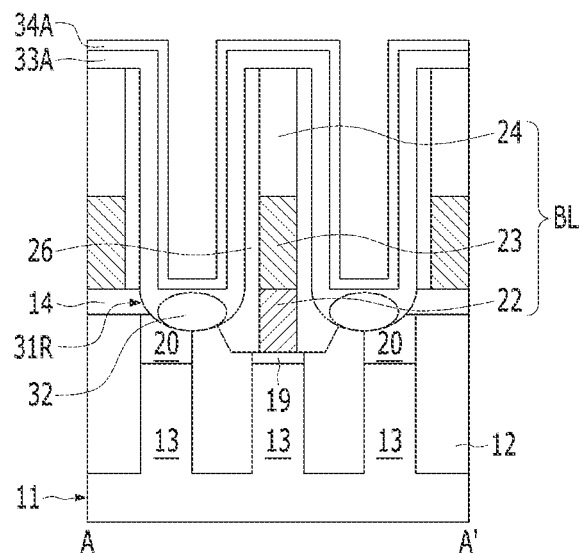
Figure 4Q:
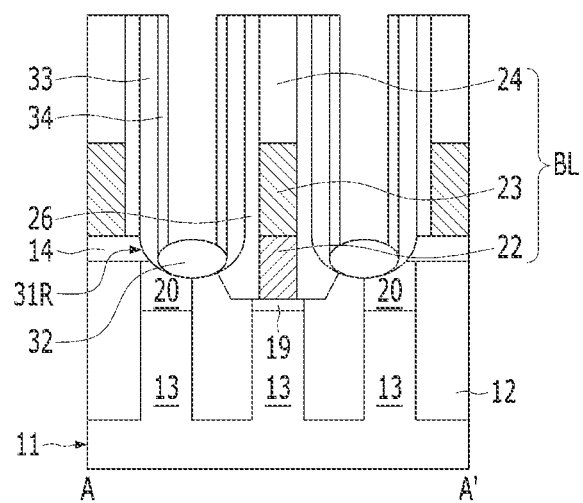
Figure 4R:
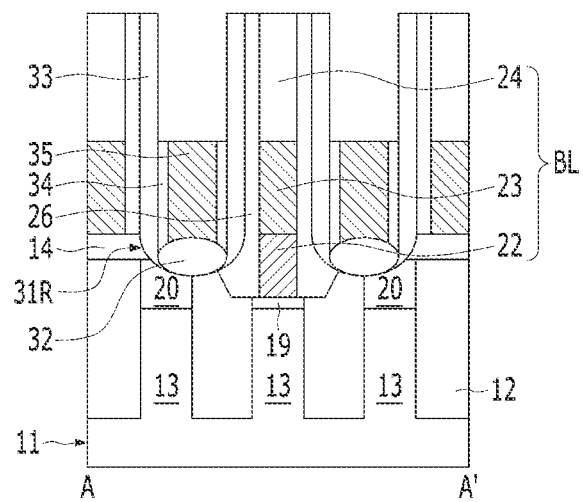
Figure 4S:
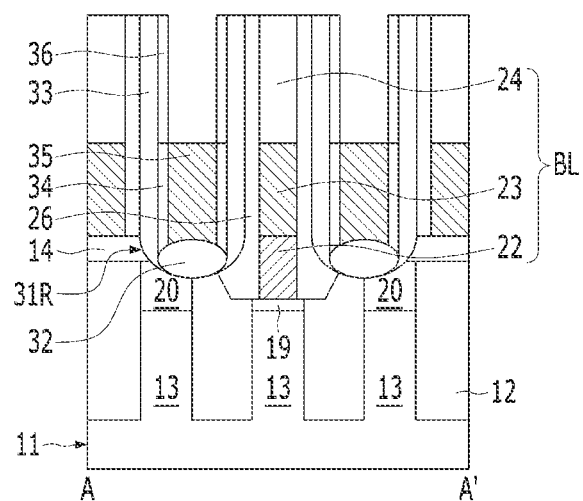
Figure 4T:
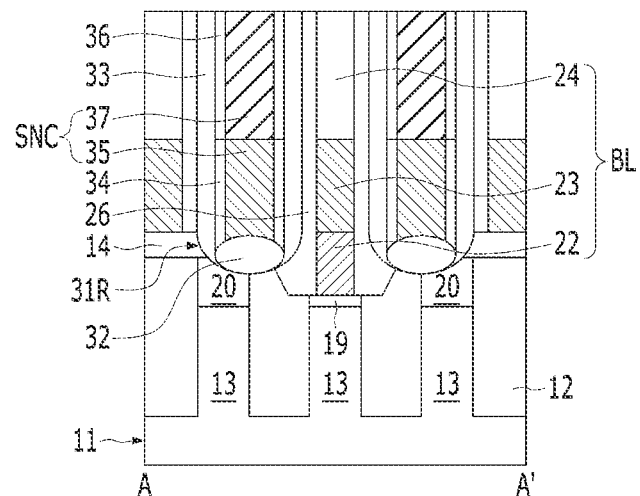
Figure 4U:
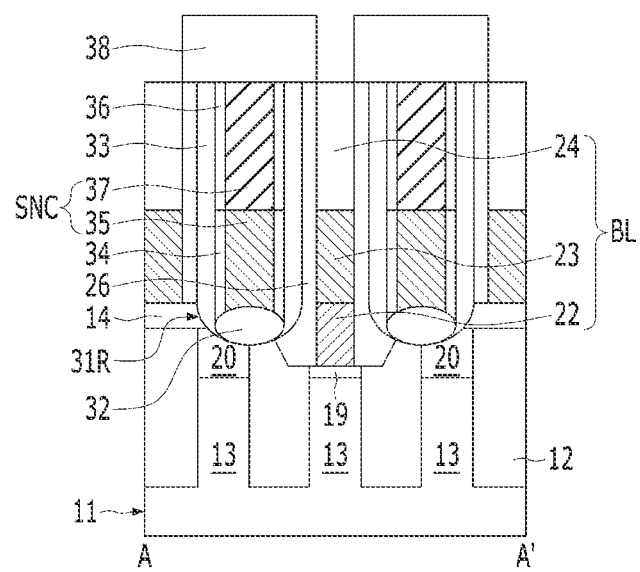
Figure 5A:
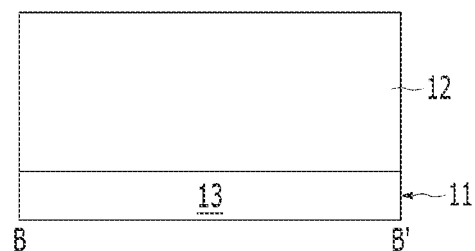
FIGS. 5A to 5U are cross-sectional views illustrating a method for fabricating a semiconductor device by presenting a cross section taken along a line B-B' of FIG. 1.

FIGS. 4A to 4U are cross-sectional views illustrating a method for fabricating a semiconductor device by presenting a cross section taken along a line A-A' of FIG. 1. FIGS. 5A to 5U are cross-sectional views illustrating a method for fabricating a semiconductor device by presenting a cross section taken along a line B-B' of FIG. 1.

As illustrated in FIGS. 4A and 5A, an isolation layer 12 may be formed in the substrate 11. The isolation layer 12 may define an active region 13. The active region 13 may include a plurality of active regions 13. The isolation layer 12 may be formed, for example, by a Shallow Trench Isolation (STI) process. The STI process may include etching the substrate 11 to form an isolation trench (not shown). The isolation trench may be filled with a dielectric material, thereby forming an isolation layer 12. The isolation layer 12 may be formed of or include, for example, silicon oxide, silicon nitride, or a combination thereof. A Chemical Vapor Deposition (CVD) process or other deposition processes may be used to fill the isolation trench with a dielectric material. A planarization process such as a Chemical Mechanic& Polishing (CMP) process may be additionally used.

Figure 5B:
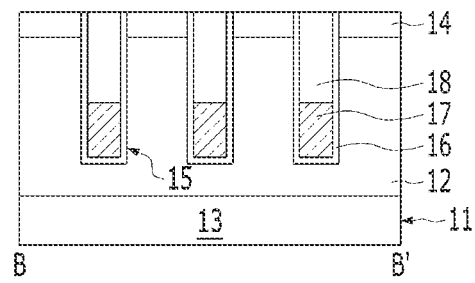

Referring to FIGS. 4B and 5B, a buried gate structure may be formed in the substrate 11. The buried gate structure may be referred to as a buried word line structure. The buried gate structure may include a gate trench 15, a gate dielectric layer 16 covering the bottom surface and sidewalls of the gate trench 15, a gate electrode 17 partially filling the gate trench 15 over the gate dielectric layer 16, and a gate capping layer 18 formed over the gate electrode 17.

The method of forming the buried gate structure may be as follows.

First, the gate trench 15 may be formed in the substrate 11. The gate trench 15 may have a line shape intersecting with the active region 13 and the isolation layer 12. The gate trench 15 may be formed by forming a mask pattern (not shown) over the substrate 11 and performing an etching process using the mask pattern as an etching mask. In order to form the gate trench 15, the hard mask layer 14 may be used as an etch barrier. The hard mask layer 14 may be formed of or include TEOS. The gate trench 15 may be formed to be shallower than the isolation trench. For example, the bottom surface of the gate trench 15 may be positioned at a higher level than the bottom surface of the isolation layer 12. The gate trench 15 may have a sufficient depth to increase the average cross-sectional area of the gate electrode 17. Accordingly, the resistance of the gate electrode 17 may be reduced. The bottom edges of the gate trench 15 be may be straight. According to another embodiment of the present disclosure (not shown), the bottom edges of the gate trench 15 may have curvature. By forming the bottom edges of the gate trench 15 to have curvature, irregularities at the bottom portion of the gate trench 15 may be minimized, and thus, the gate electrode 17 may be filled more readily.

Although not illustrated, after the gate trench 15 is formed, a fin region may be formed. The fin region may be formed by recessing a portion of the isolation layer 12.

Subsequently, a gate dielectric layer 16 may be formed on the bottom surface and sidewalls of the gate trench 15. Before the gate dielectric layer 16 is formed, etching damage on the surface of the gate trench 15 may be cured. For example, in the curing process, a thermal oxidation process for curing the surface of the gate trench 15 and a process of removing the sacrificial oxide formed on the surface of the gate trench 15 by the thermal oxidation process may be sequentially performed.

The gate dielectric layer 16 may be formed, for example, by a thermal oxidation process. For example, the gate dielectric layer 16 may be formed by oxidizing the bottom and sidewalls of the gate trench 15.

According to another embodiment of the present disclosure, the gate dielectric layer 16 may be formed, for example, by a vapor deposition method such as a Chemical Vapor Deposition (CVD) process or an Atomic Layer Deposition (ALD) process. The gate dielectric layer 16 may include, for example, a high-k material, an oxide, a nitride, an oxynitride, or a combination thereof. The high-k material may include, for example, a hafnium-containing material. The hafnium-containing material may include hafnium oxide, hafnium silicon oxide, hafnium silicon oxynitride, or a combination thereof. According to another embodiment of the present disclosure, the high-k material may include, for example, lanthanum oxide, lanthanum aluminum oxide, zirconium oxide, zirconium silicon oxide, zirconium silicon oxynitride, aluminum oxide, and a combination thereof. As for the high-k material, other known high-k materials may be used selectively.

According to another embodiment of the present disclosure, the gate dielectric layer 16 may be formed by depositing a liner polysilicon layer and then radically oxidizing the liner polysilicon layer.

According to yet another embodiment of the present disclosure, the gate dielectric layer 16 may be formed by forming a liner silicon nitride layer and then radically oxidizing the liner silicon nitride layer.

Subsequently, the gate electrode 17 may be formed over the gate dielectric layer 16. To form the gate electrode 17, a recessing process may be performed after forming a conductive layer (not shown) to fill the gate trench 15. The recessing process may be performed as an etch-back process, or the recessing process may be performed by sequentially performing a CMP process and an etch-back process. The gate electrode 17 may have a recessed shape that only partially fills the gate trench 15. For example, the surface of the upper portion of the low gate electrode 17 may be positioned at a lower level than the surface of the upper portion of the active region 13. The gate electrode 17 may include, for example, a metal, a metal nitride, or a combination thereof. For example, the gate electrode 17 may be formed of titanium nitride (TiN), tungsten (W), or titanium nitride/tungsten (TiN/W). The titanium nitride/tungsten (TiN/W) may have a structure in which titanium nitride is conformally formed and then the gate trench 15 is partially filled with tungsten. As the gate electrode 17, titanium nitride may be used alone, and this may be referred to as a gate electrode 17 having a 'TiN Only' structure.

Subsequently, a gate capping layer 18 may be formed over the gate electrode 17. The gate capping layer 18 may be formed of or include a dielectric material. The remaining portion of the gate trench 15 over the gate electrode 17 may be filled with the gate capping layer 18. The gate capping layer 18 may be formed of or include, for example, silicon oxide. According to yet another embodiment of the present disclosure, the gate capping layer 18 may have a NON (Nitride-Oxide-Nitride) structure. The surface of the upper portion of the gate capping layer 18 may be positioned at the same level as the surface of the upper portion of the hard mask layer 14. To this end, when the gate capping layer 18 is formed, a Chemical Mechanical Polishing (CMP) process may be performed by setting the upper surface of the hard mask layer 14 as an etch stop target.

After the buried gate structure is formed as described above, the first impurity region 19 and the second impurity region 20 may be formed. The first impurity region 19 and the second impurity region 20 may be formed, for example, by a doping process, such as an implantation process. The first impurity region 19 and the second impurity region 20 may have the same depth. According to another embodiment of the present disclosure, the first impurity region 19 may be deeper than the second impurity region 20. The first impurity region 19 and the second impurity region 20 may be referred to as source/drain regions. The first impurity region 19 may be a region to which a bit line contact plug is coupled. The second impurity region 20 may be a region to which the storage node contact plug is coupled.

A cell transistor of a memory cell may be formed by the gate electrode 17, the first impurity region 19, and the second impurity region 20.

Figure 5C:
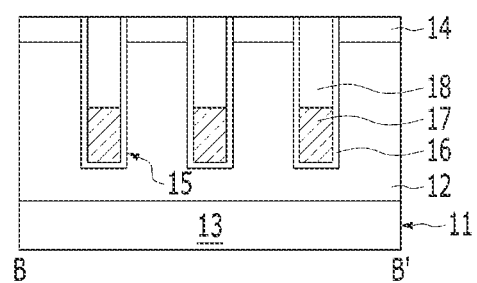

Referring to FIGS. 4C and 5C, a first contact hole 21 may be formed. The hard mask layer 14 may be etched by using a contact mask (not shown) to form the first contact hole 21. The first contact hole 21 may have a circular shape or an elliptical shape when viewed from the perspective of a plan view. A portion of the substrate 11 may be exposed by the first contact hole 21. The first contact hole 21 may have a diameter controlled to a predetermined line width. The first contact hole 21 may have a shape exposing a portion of the active region 13. For example, the first impurity region 19 may be exposed through the first contact hole 21. The first contact hole 21 may have a diameter which is larger than the width of the short axis of the active region 13. Accordingly, in an etching process for forming the first contact hole 21, the first impurity region 19, the isolation layer 12, and a portion of the gate capping layer 18 may be etched. For example, the gate capping layer 18, the first impurity region 19, and the isolation layer 12 below the first contact hole 21 may be recessed to a predetermined depth. Accordingly, the bottom portion of the first contact hole 21 may extend into the substrate 11. As the first contact hole 21 extends, the surface of the first impurity region 19 may be recessed, and the surface of the first impurity region 19 may be positioned at a lower level than the surface of the active region 13. The first contact hole 21 may be referred to as a 'bit line contact hole'.

Figure 5D:
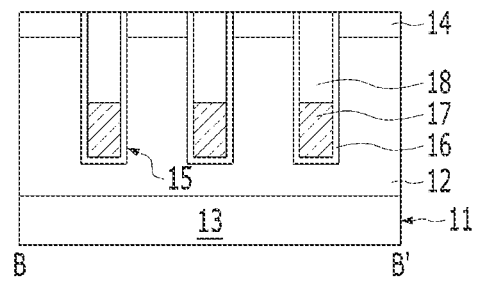

Referring to FIGS. 4D and 5D, a preliminary plug 22A may be formed. The preliminary plug 22A may be formed, for example, by a selective Epitaxial Growth (SEG) process. For example, the preliminary plug 22A may include SEG SiP. For example, the preliminary plug 22A may be formed without voids by the selective epitaxial growth. According to another embodiment of the present disclosure, the preliminary plug 22A may be formed by depositing polysilicon and performing a CMP process. The preliminary plug 22A may fill the first contact hole 21. The surface of the upper portion of the preliminary plug 22A may be positioned at the same level as the surface of the upper portion of the hard mask layer 14.

Figure 5E:
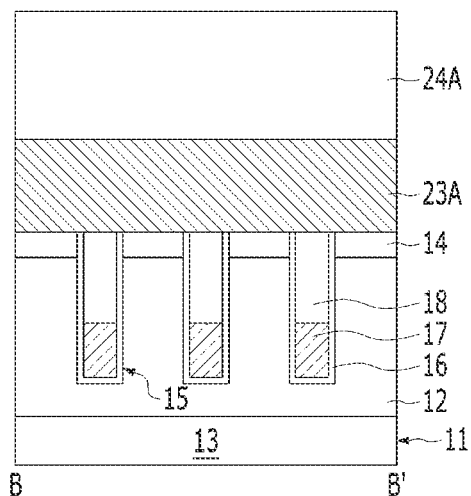

Referring to FIGS. 4E and 5E, a conductive layer 23A and a hard mask material layer 24A may be stacked. A conductive layer 23A and a hard mask material layer 24A may be sequentially stacked over the preliminary plug 22A and the hard mask layer 14. The conductive layer 23A may include a metal-containing material. The conductive layer 23A may include a metal, a metal nitride, a metal silicide, or a combination thereof. According to an embodiment of the present disclosure, the conductive layer 23A may include tungsten (W). According to another embodiment of the present disclosure, the conductive layer 23A may include a stack of titanium nitride and tungsten (TiN/W). The titanium nitride may serve as a barrier. The hard mask material layer 24A may be formed of a dielectric material having an etch selectivity with respect to the conductive layer 23A and the preliminary plug 22A. The hard mask material layer 24A may be formed of or include, for example, silicon oxide or silicon nitride.

A bit line mask layer 25 may be formed over the hard mask material layer 24A. The bit line mask layer 25 may be formed of a material having an etch selectivity with respect to the conductive layer 23A and the hard mask material layer 24A. The bit line mask layer 25 may include a photoresist pattern. The bit line mask layer 25 may be formed, for example, by a patterning method, such as SPT (spacer patterning technology) or DPT (double patterning technology). When viewed from the perspective of a plan view, the bit line mask layer 25 may have a line shape extending in one direction.

Figure 5F:
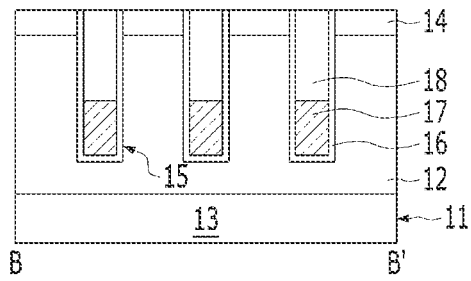

As illustrated in FIGS. 4F and 5F, a bit line 23 and a bit line contact plug 22 may be formed. The bit line 23 and the bit line contact plug 22 may be formed concurrently using a single etching process. The bit line 23 and the bit line contact plug 22 may be formed, for example, by an etching process using the bit line mask layer 25 (refer to FIG. 4E).

The hard mask material layer 24A (see FIG. 4E) and the conductive layer 23A (see FIG. 4E) may be etched by using the bit line mask layer 25 as an etch barrier. Accordingly, a bit line structure including the bit line 23 and the bit line hard mask layer 24 may be formed. The bit line 23 may be formed by etching the conductive layer 23A. The bit line hard mask layer 24 may be formed by etching the hard mask material layer 24A.

Subsequently, the preliminary plug 22A (refer to FIG. 4E) may be etched with the same line width as that of the bit line 23. As a result, the bit line contact plug 22 may be formed. The bit line contact plug 22 may be formed over the first impurity region 19. The bit line contact plug 22 may couple the first impurity region 19 and the bit line 23 to each other. The bit line contact plug 22 may be formed in the first contact hole 21. The line width of the bit line contact plug 22 may be smaller than the diameter of the first contact hole 21. As a result, a gap G may be formed around the bit line contact plug 22.

As described above, by forming the bit line contact plug 22, the gap G may be formed inside the first contact hole 21. This is because the bit line contact plug 22 is formed by being etched smaller than the diameter of the first contact hole 21. The gap G may not have a surrounding shape that surrounds the bit line contact plug 22 but may be formed independently on each of both sidewalls of the bit line contact plug 22. Consequently, one bit line contact plug 22 and a pair of gaps G may be positioned in the first contact hole 21, and the pair of gaps G may be isolated by the bit line contact plugs 22. The bottom surface of the gaps G may be positioned at the same level as the recessed upper surface of the first impurity region 19. According to another embodiment of the present disclosure, the bottom surface of the gaps G may extend into the isolation layer 12. For example, the bottom surface of the gaps G may be positioned at a lower level than the recessed upper surface of the first impurity region 19.

Subsequently, the bit line mask layer 25 (refer to FIG. 4E) may be removed.

Figure 5G:
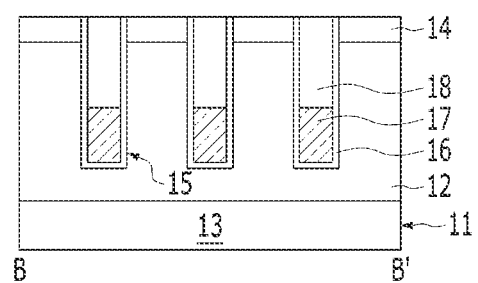

Referring to FIGS. 4G and 5G, a bit line spacer 26 may be formed. The bit line spacer 26 may be positioned on the sidewalls of the bit line contact plug 22 and the bit line 23. The bit line spacer 26 may have a line shape extending in parallel to both sidewalls of the bit line 23.

The lower end of the bit line spacer 26 may fill the gap G while covering both sidewalls of the bit line contact plug 22. In order to form the bit line spacer 26, a bit line spacer material (not shown) may be deposited and an etch-back process may be performed.

The bit line spacer 26 may be formed of or include, for example, silicon oxide, silicon nitride, or a combination thereof. The bit line spacer 26 may include a NON (Nitride-Oxide-Nitride) structure. According to another embodiment of the present disclosure, the bit line spacer 26 may include an air gap. For example, at may include a NAN (Nitride-Air gap-Nitride) structure.

Figure 5H:
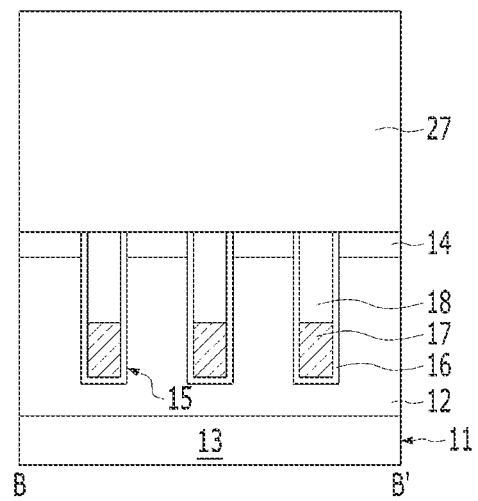

Referring to FIGS. 4H and 5H, a sacrificial layer 27 may be formed. The sacrificial layer 27 may gap-fill the space between the bit line structures BL. The sacrificial layer 27 may be formed of or include, for example, silicon oxide. The sacrificial layer 27 may include, for example, a Spin-On-Dielectric material (SOD). The sacrificial layer 27 may be formed by forming a dielectric material for gap-filling the space between bit line structures and then performing a planarization process. The upper surface of the sacrificial layer 27 may be positioned at the same level as the upper surface of the bit line structure.

Figure 5I:
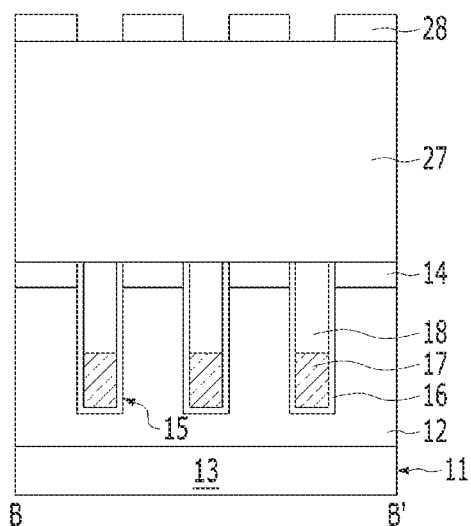

Referring to FIGS. 4I and 5I, a plug isolation mask layer 28 may be formed over the sacrificial layer 27. The plug isolation mask layer 28 may be formed of a material having an etch selectivity with respect to the bit line hard mask layer 24 and the sacrificial layer 27. The plug isolation mask layer 28 may include a photoresist. The plug isolation mask layer 28 may be formed in a line shape. The plug isolation mask layer 28 may have a line shape extending in a direction intersecting with the bit line 23. For example, the plug isolation mask layer 28 may have a line shape extending in a direction parallel to the gate electrode 17. The plug isolation mask layer 28 may be formed not to overlap with the gate electrode 17. For example, the plug isolation mask layer 28 may be patterned so that a portion overlapping with the gate electrode 17 is opened.

Figure 5J:
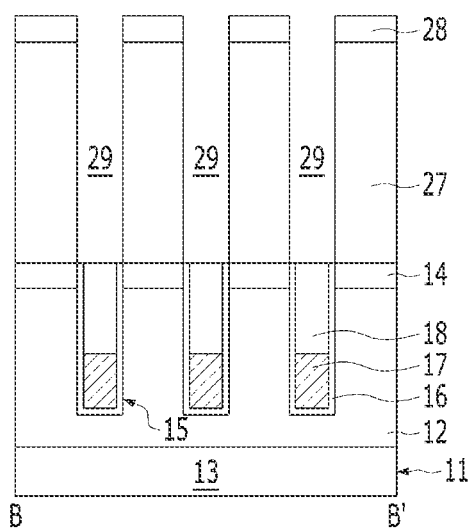

Referring to FIGS. 4J and 5J, the sacrificial layer 27 may be etched by using the plug isolation mask layer 28 as an etch barrier. As a result, a plug isolation portion 29 may be formed.

Figure 5K:
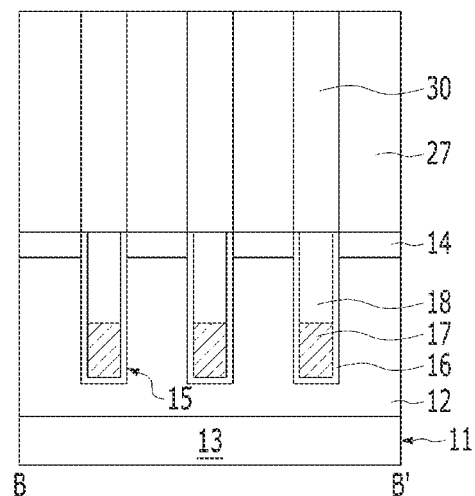

Referring to FIGS. 4K and 5K, the plug isolation mask layer 28 (refer to FIG. 4J) may be removed.

Subsequently, a plug isolation layer 30 may be formed in the plug isolation portion 29. In order to form the plug isolation layer 30, a dielectric material may be formed to fill the plug isolation portion 29, and then a planarization process may be performed. The plug isolation layer 30 may include a material having an etch selectivity with respect to the sacrificial layer 27. For example, the plug separation layer 30 may be made of or include silicon nitride.

Figure 5L:
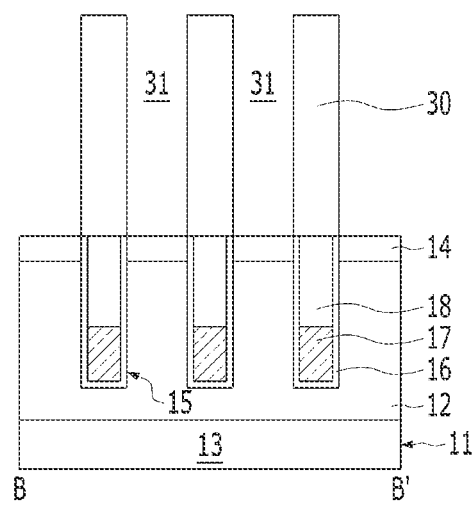

Referring to FIGS. 4L and 5L, the remaining sacrificial layer 27 (refer to FIG. 4K) may be removed. The remaining sacrificial layer 27 may be removed, for example, by a wet etching process. The remaining sacrificial layer may be removed, for example, by a dip-out process. The process of removing the remaining sacrificial layer 27 may be performed under the conditions having an etching selectivity with respect to the plug isolation layer 30 and the bit line hard mask layer 24. Accordingly, only the remaining sacrificial layer 27 may be selectively removed without loss of other structures.

As the remaining sacrificial layer is removed, openings 31 may be formed by the plug isolation layer 30 and the bit line structure BL. The openings 31 may have a shape of individually separated islands. The openings 31 may be referred to as storage node contact holes.

As described above, the opening 31 may be formed by depositing the sacrificial layer 27, forming the plug isolation portion 29, forming the plug isolation layer 30, and removing the sacrificial layer 27 sequentially. A series of the processes may be referred to as a 'damascene process', and the opening 31 may be formed by the damascene process.

From the perspective of a plan view, the opening 31 may have a rectangular shape. The size of the opening 31 may be determined by the bit line spacer 26 and the plug isolation layer 30.

Figure 5M:
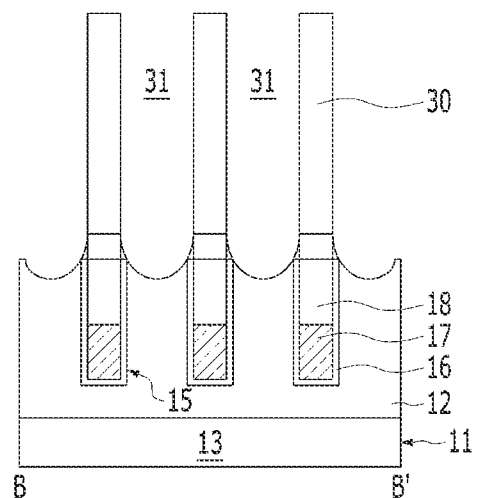

Referring to FIGS. 4M and 5M, a portion of the plug isolation layer 30 and a portion of the bit line spacer 26 may be etched to increase the width of the opening 31.

Subsequently, a recess 31R may be formed below the opening 31. To form the recess 31R, the hard mask layer 14, the isolation layer 12, and the second impurity region 20 may be etched to a predetermined depth. The recess 31R may extend into the substrate 11. The bottom surface of the recess 31R may be positioned at a lower level than the upper portion surface of the bit line contact plug 22. The bottom surface of the recess 31R may be positioned at a higher level than the bottom surface of the bit line contact plug 22.

Figure 5N:
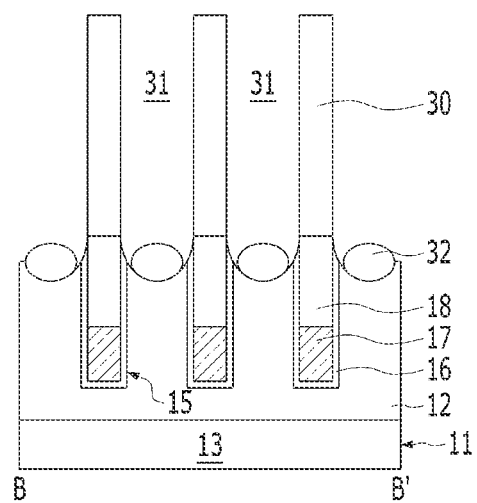

Referring to FIGS. 4N and 5N, a pad 32 may be formed to fill a portion of the recess 31R. The pad 32 may be formed, for example, by a bottom-up growth process. The pad 32 may be formed, for example, by a selective epitaxial growth (SEG) process. The pad 32 may be grown by using the second impurity region 20 as a seed. The pad 32 may include a silicon-containing material. The pad 32 may be an epitaxial layer. The pad 32 may be, for example, a silicon-containing epitaxial layer. The pad 32 may include, for example, SEG Si, SEG SiGe or SEG SiC. According to another embodiment of the present disclosure, the pad 32 may include, for example, SEG Si doped with an N-type dopant, SEG SiGe doped with an N-type dopant, or SEG SiG doped with an N-type dopant. For example, the pad 32 may include SEG SiP. The pad 32 may be formed by using a silicon source gas and an additive gas. The silicon source gas may include silane ($SiH_4$), dichlorosilane ($SiH_2Cl_2$, DCS), or a mixture thereof. The additive gas may contain HCl.

The upper surface of the pad 32 may be positioned at a lower level than the upper surface of the bit line contact plug 22.

As above, since selective epitaxial growth is performed to form the pad 32, the process may be simplified. Also, the inside of the recess 31R may be filled with the pad 32 without voids.

In particular, in this embodiment, the plug isolation layer 30 may be formed to define openings 31 of an individually separated island type by a plug isolation layer 30 and a bit line structure, and by forming the pads 32 at the bottom portion of the opening 31, it is possible to prevent a short caused by a bridge between the storage node contact plugs. That is, since the pad 32 is formed only inside the island-type opening 31, epitaxial growth may be performed regardless of the growth extent of the pad 32. Accordingly, it is possible to employ detailed conditions for controlling the growth of the pad 32, thereby reducing the process difficulty.

According to an embodiment of the present disclosure, after the pad 32 is formed, in-situ annealing may be performed in the ambient of hydrogen ($H_2$). Silicon migration may occur due to the in-situ annealing in the ambient of a hydrogen.

For example, the pad 32 may be formed of SEG Si or SEG SiP. When the pad 32 is formed of SEG SiP, the contact resistance with the silicon active region may be improved. SEG SiP may be formed by co-flowing $PH_3$ gas during the SEG process.

A method of forming the pad 32 of SEG SiP may be as follows.

SEG SiP may be formed by using a phosphorus-containing gas, a silicon-containing gas, and a chlorine-containing gas. The chlorine-containing gas may include HCl. The phosphorus-containing gas and the silicon-containing gas may be referred to as a phosphorus-containing precursor and a silicon-containing precursor, respectively. For example, the phosphorus-containing gas may be or include phosphine ($PH_3$). Also, for example, the silicon-containing gas may include silane ($SiH_4$), disilane ($Si_2H_6$), trisilane ($Si_3H_3$), dichlorosilane ($SiH_2Cl_2$: DCS), or a combination thereof. In the selective epitaxial growth (SEG), it may be difficult to secure a selectivity for a dielectric material. Accordingly, in this embodiment, epitaxial growth may be performed by mixing dichlorosilane (DCS) and silane ($SiH_4$) to secure a selectivity with respect to a dielectric material. Accordingly, the growth rate may be increased as adsorption is accelerated by controlling the Cl functional group on the surface of the epitaxy growth. Accordingly, the window for securing a selectivity by HCl may become larger. When dichlorosilane ($SiH_2Cl_2$) and silane ($SiH_4$) are mixed, the doping level of phosphorus in SEG SiP may be increased.

The formation of SEG SiP may include an in-situ doping process. For example, an in-situ doping process may be performed by co-flowing phosphine ($PH_3$), while a silicon epitaxial layer is deposited.

As described above, SEG SiP may be formed at a low temperature of approximately 550° C. to 650° C. by using silane ($SiH_4$), dichlorosilane (DCS), HCl, and phosphine ($PH_3$).

Figure 5O:
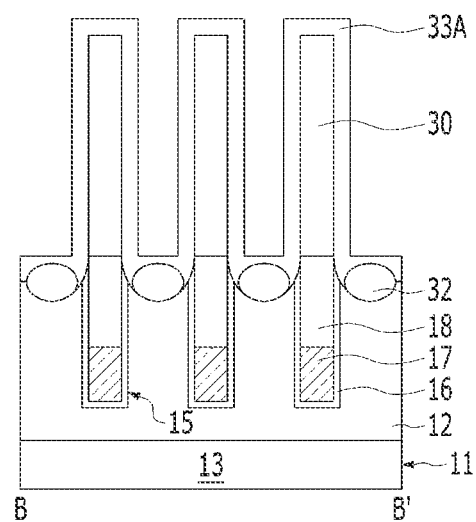

Referring to FIGS. 4O and 5O, a first spacer layer 33A may be formed. The first spacer layer 33A may cover the pad 32. The first spacer layer 33A may cover the bit line spacer 26. The first spacer layer 33A may fill the remaining portion of the recess 31R in which the pad 32 is formed. The first spacer layer 33A may be formed of or include, for example, silicon oxide.

Figure 5P:
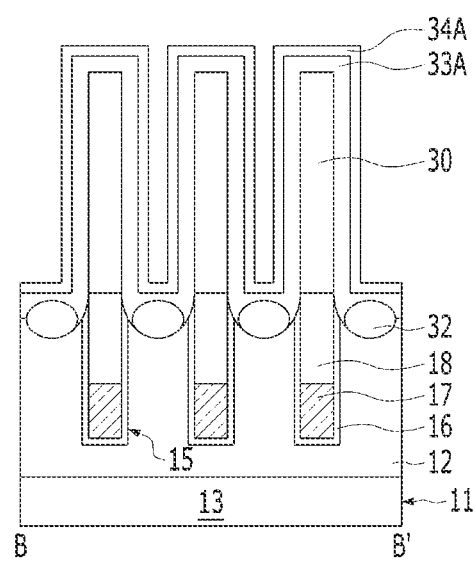

Referring to FIGS. 4P and 5P, a liner layer 34A may be formed over the first spacer layer 33A. The liner layer 34A may be formed of or include, for example, polysilicon.

Figure 5Q:
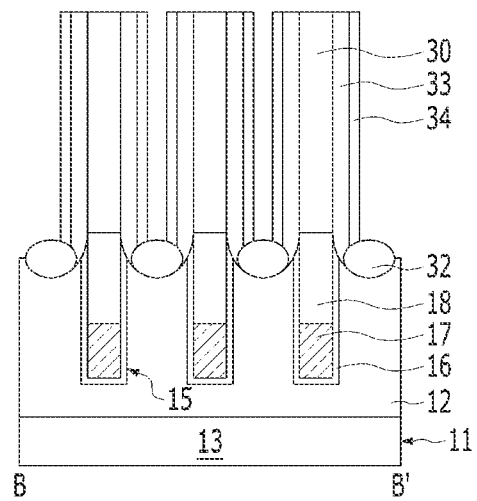

Referring to FIGS. 4Q and 5Q, the liner layer 34A and the first spacer layer 33A may be etched to expose the pad 32.

Accordingly, the first spacer 33 and the plug liner 34 may be formed over the bit line spacer 26 (that is, the sidewall of the bit line spacer 26). Namely, a spacer structure in which the bit line spacer 26, the first spacer 33 and the plug liner 34 are stacked may be formed on the sidewall of the bit line 23.

In particular, in the present embodiment, the parasitic capacitance of the bit line may be reduced by forming the first spacer 33 of an oxide. Also, by forming the plug liner 34 of silicon, it is possible to prevent the first spacer 33 from being damaged in the subsequent cleaning process. Moreover, since the plug liner 34 can serve as a storage node contact plug together with a conductive material filling the opening 31 in the subsequent process, the width of the storage node contact plug may be expanded.

After the etching process is completed, a cleaning process may be performed. Herein, loss of the first spacer layer 33A (refer to FIG. 4P) may be prevented by the liner layer 34A (see FIG. 4P).

Figure 5R:
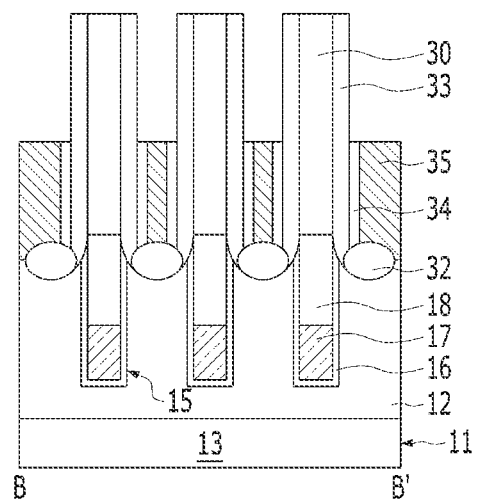

Referring to FIGS. 4R and 5R, a first plug 35 filling the lower portion of the opening 31 may be formed over the pad 32. The first plug 35 may directly contact the pad 32. The first plug 35 may be a silicon-containing material or a metal material. The first plug 35 may be formed of or include, for example, polysilicon. To form the first plug 35, after depositing polysilicon to fill the opening 31, a recessing process may be performed. The upper surface of the first plug 35 and the upper surface of the bit line 23 may be positioned at the same level. During the recessing process for forming the first plug 35, the plug liner 34 may be recessed together so that it may remain only on the sidewall of the first plug 35. For example, the plug liner 34 may have an upper surface at the same level as the first plug 35. The plug liner 34 may serve as a contact plug together with the first plug 35.

Figure 5S:
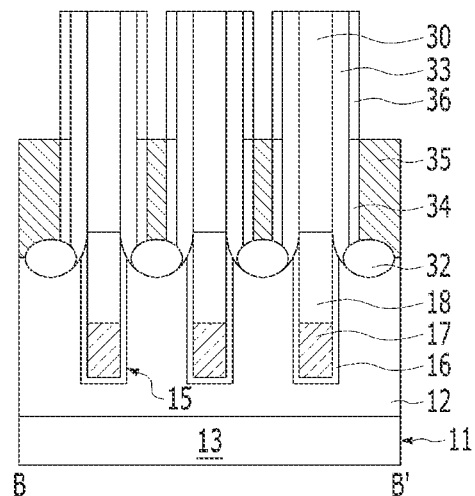

Referring to FIGS. 4S and 5S, a second spacer 36 may be formed over the plug liner 34, that is, on a sidewall of the first spacer 33. The second spacer 36 may be formed of or include silicon nitride.

Figure 5T:
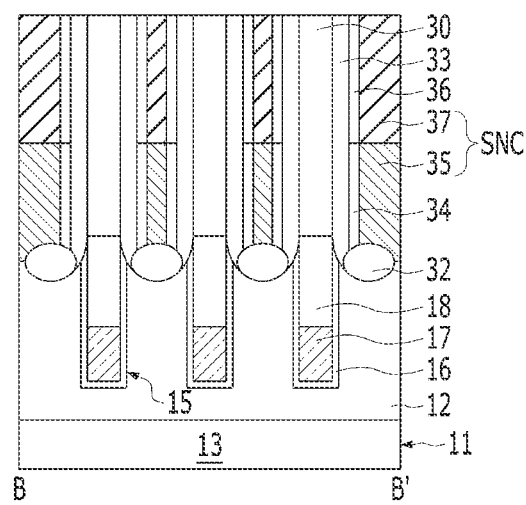
Figure 5U:
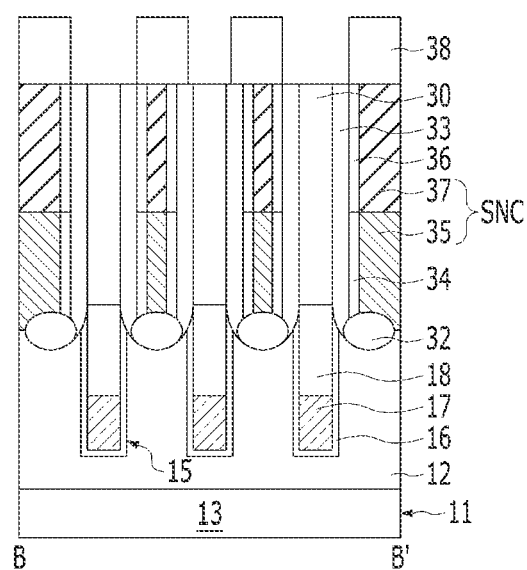

Referring to FIGS. 4T and 5T, a second plug 37 filling the remaining portion of the opening 31 may be formed over the first plug 35.

The second plug 37 may be a metal material. The second plug 37 may be formed of or include tungsten. The second plug 37 may be a material having a lower resistance than the first plug 35. The second plug 37 may be formed of or include titanium, titanium nitride, tungsten, or a combination thereof. For example, the second plug 27 may be TiN/W in which tungsten is stacked over titanium nitride.

According to another embodiment of the present disclosure, an ohmic contact layer may be further formed between the first plug 35 and the second plug 37. The ohmic contact layer may include a metal silicide. The ohmic contact layer may include cobalt silicide, titanium silicide, or nickel silicide. Contact resistance may be lowered by the ohmic contact layer.

According to another embodiment of the present disclosure, an interface doping layer may be further formed between the first plug 35 and the ohmic contact layer. The interface doping layer may be formed by doping an impurity in the upper portion region of the first plug 35. The interface doping layer may be doped with phosphorus. The first plug 35 and the interface doped layer may be doped with the same dopant. The first plug 35 and the interface doping layer may have different dopant concentrations. The dopant concentration of the interface doping layer may be higher than that of the first plug 35. Contact resistance may be lowered by the interface doping layer.

A contact plug SNC may be formed by the first plug 35 and the second plug 37. The contact plug SNC may be referred to as a 'storage node contact plug'. When the contact plug SNC is formed over the pad 32, connection failure between the storage node contact plugs may be minimized.

Referring to FIGS. 4U and 5U, a memory element 38 including a capacitor may be formed over the second plug 37.

The memory element 38 may include a capacitor including a storage node. The storage node, for example, may be or include a pillar type. Although not illustrated, a dielectric layer and a plate node may be further formed over the storage node. In an embodiment, the storage node may have a cylinder shape.

According to an embodiment of the present disclosure, the reliability of a semiconductor device may be improved by applying a pad formed by a Selective Epitaxial Growth (SEG) process to the bottom of each of the isolated openings.

While the present invention has been described with respect to the above specific embodiments, it will be apparent to those skilled in the art that various changes and modifications may be made without departing from the spirit and scope of the invention as defined in the following claims.

What is claimed is:

1. A semiconductor device, comprising:
a semiconductor substrate including an active region;
a plurality of conductive structures formed over the semiconductor substrate;
an isolation layer filling a space between the conductive structures and having an opening that exposes the active region between the conductive structures;
a pad formed in a bottom portion of the opening and in contact with the active region;
a plug liner formed conformally over a sidewall of the opening and exposing the pad; and
a contact plug formed over the pad inside the opening, wherein a bottom portion of the opening is positioned at a lower level than an upper surface of the active region.

2. The semiconductor device of claim 1, wherein the pad includes an epitaxial layer.

3. The semiconductor device of claim 1, further comprising:
an oxide spacer between the sidewall of the opening and the plug liner.

4. The semiconductor device of claim 1, wherein an upper surface of the isolation layer is at the same level as an upper surface of the conductive structure.

5. The semiconductor device of claim 1, wherein the plug liner includes polysilicon.

6. A semiconductor device, comprising:
a semiconductor substrate including an active region;
a plurality of bit line structures formed over the semiconductor substrate;
an isolation layer filling a space between the bit line structures and having an opening that exposes the active region between the bit line structures;
a pad formed in a bottom portion of the opening and in contact with the active region;
a first spacer formed over conformally on a sidewall of the opening and exposing the pad;
a plug liner formed to cover a lower portion of the first spacer;
a second spacer formed over the plug liner to cover an upper portion of the first spacer; and
a contact plug formed over the pad inside of the opening.

7. The semiconductor device of claim 6, wherein the contact plug includes:
a first plug having an upper surface at the same level as the plug liner; and
a second plug formed over the first plug and having an upper surface at the same level as the second spacer.

8. The semiconductor device of claim 6, wherein the pad includes an epitaxial layer.

9. The semiconductor device of claim 6, wherein the first spacer includes silicon oxide, and the second spacer includes silicon nitride.

10. The semiconductor device of claim 6, wherein the plug liner includes polysilicon.

11. The semiconductor device of claim 6, further comprising:
a word line buried in the semiconductor substrate;
first source/drain regions and second source/drain regions formed in the semiconductor substrate on both sides of the word line;
a bit line contact plug formed over the first source/drain regions; and
a bit line over the bit line contact plug,
wherein the pad is coupled to the second source/drain regions.

* * * * *